United States Patent [19]
Kurek et al.

[11] 4,222,166
[45] Sep. 16, 1980

[54] METHOD AND APPARATUS FOR LOADING CIRCUIT BOARDS

[75] Inventors: Harry F. Kurek, 650 Taylor St., Sunnyvale, Calif. 94086; Austin R. Silvester, Cupertino, Calif.

[73] Assignee: Harry F. Kurek, Sunnyvale, Calif.

[21] Appl. No.: 911,849

[22] Filed: Jun. 2, 1978

[51] Int. Cl.² .............................................. H05K 3/30
[52] U.S. Cl. ....................................... 29/831; 29/741; 29/809; 221/301; 414/126; 414/404
[58] Field of Search ................ 29/741, 740, 742, 407, 29/809, 749, 750, 759, 429, 626; 214/301, 8.5 K, 8.5 A; 221/301, 299, 251, 155, 298; 312/183; 198/420, 339

[56] References Cited

U.S. PATENT DOCUMENTS

| | | | |
|---|---|---|---|
| 2,738,899 | 3/1956 | Hansen et al. | 222/251 |
| 3,138,288 | 6/1964 | Ine et al. | 221/298 X |
| 3,265,246 | 8/1966 | Messenger | 221/155 X |
| 3,365,259 | 1/1968 | Heisman et al. | 312/184 X |
| 3,564,691 | 2/1971 | Ackerman | 29/741 |
| 3,753,606 | 8/1973 | Ozeki | 312/183 X |
| 3,760,484 | 9/1973 | Kowalski | 29/809 X |

OTHER PUBLICATIONS

Advertisement: Micro Electronic Systems, Inc., Pic-A-Dip IC Dispenser.
Advertisement: Pic-A-Dip III (from Micro Electronic Systems, Inc., IC Handling Tools and Systems Catalog.

*Primary Examiner*—Carl E. Hall
*Assistant Examiner*—C. J. Arbes
*Attorney, Agent, or Firm*—Townsend and Townsend

[57] ABSTRACT

Method and apparatus for serially dispensing dual-in-line-type integrated circuit devices for use in manually loading circuit boards. Integrated circuit devices are placed in queues in a plurality of dispensers. The dispensers are adapted to serially release individual circuit devices to an access position within the dispensers. The dispensers are mounted on laterally moveable frames in a rack and can be withdrawn from the rack over a circuit board at an array position substantially directly over and adjacent the position on the circuit board into which the circuit devices are to be loaded. The dispensers comprise an indexing head which is adapted to release only single ones of circuit devices for rapid and convenient manual transfer from the access position of the dispensers to the load position of the board. A plurality of stations can be disposed in an assembly line with a board advancement mechanism to implement speed controlled loading of circuit boards.

8 Claims, 4 Drawing Figures

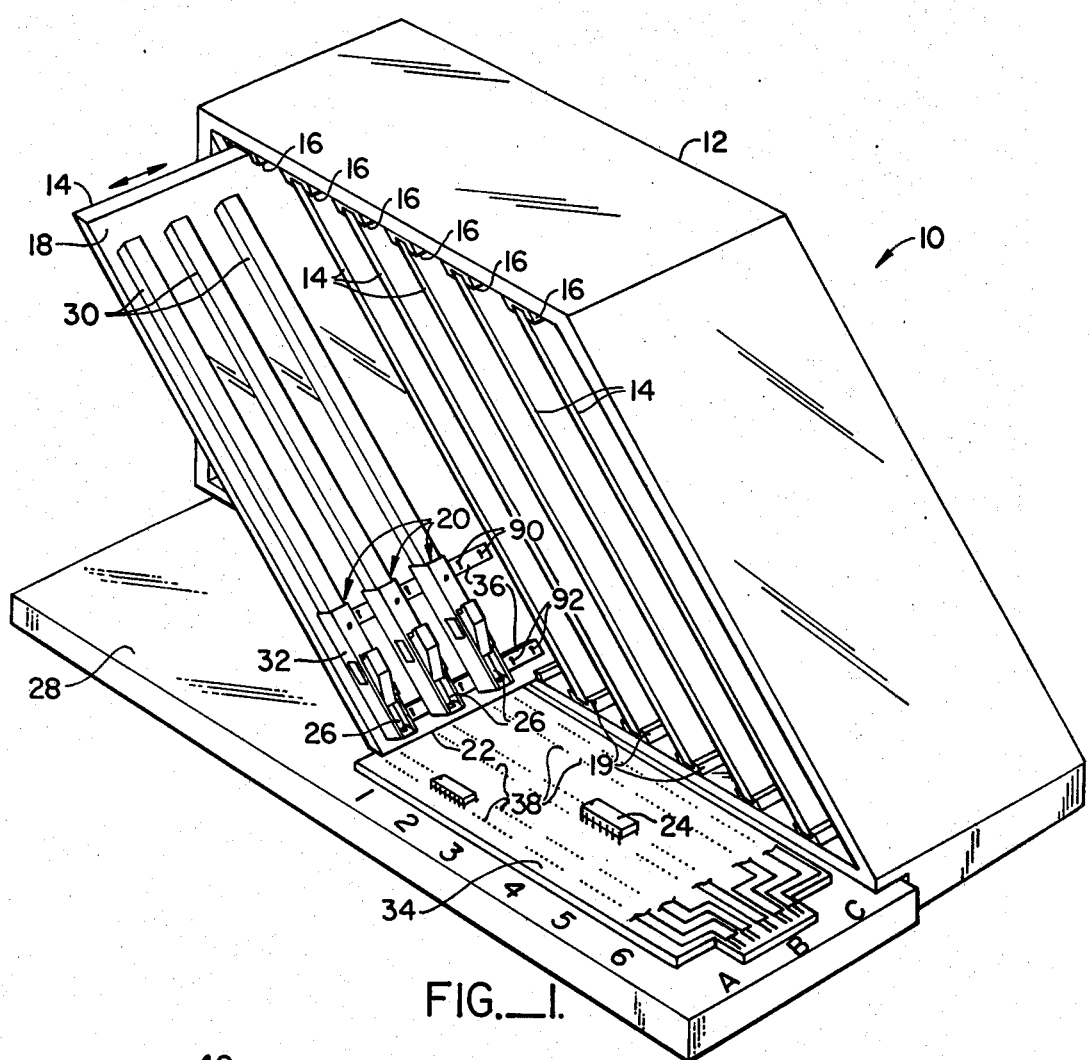
FIG._1.
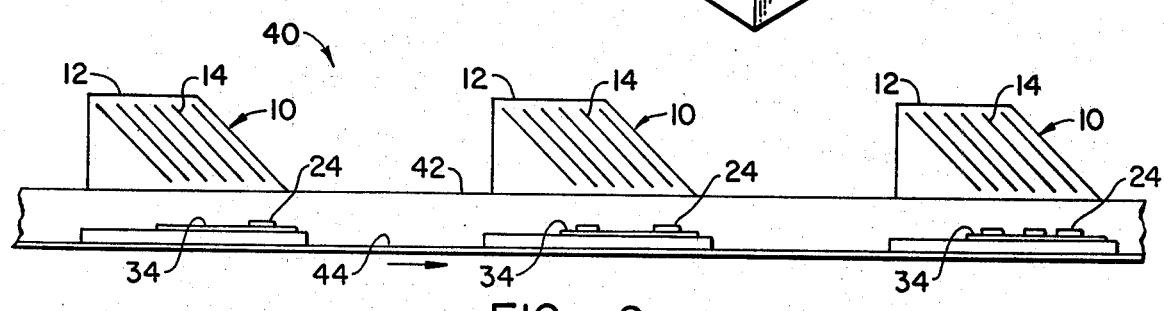
FIG._2.

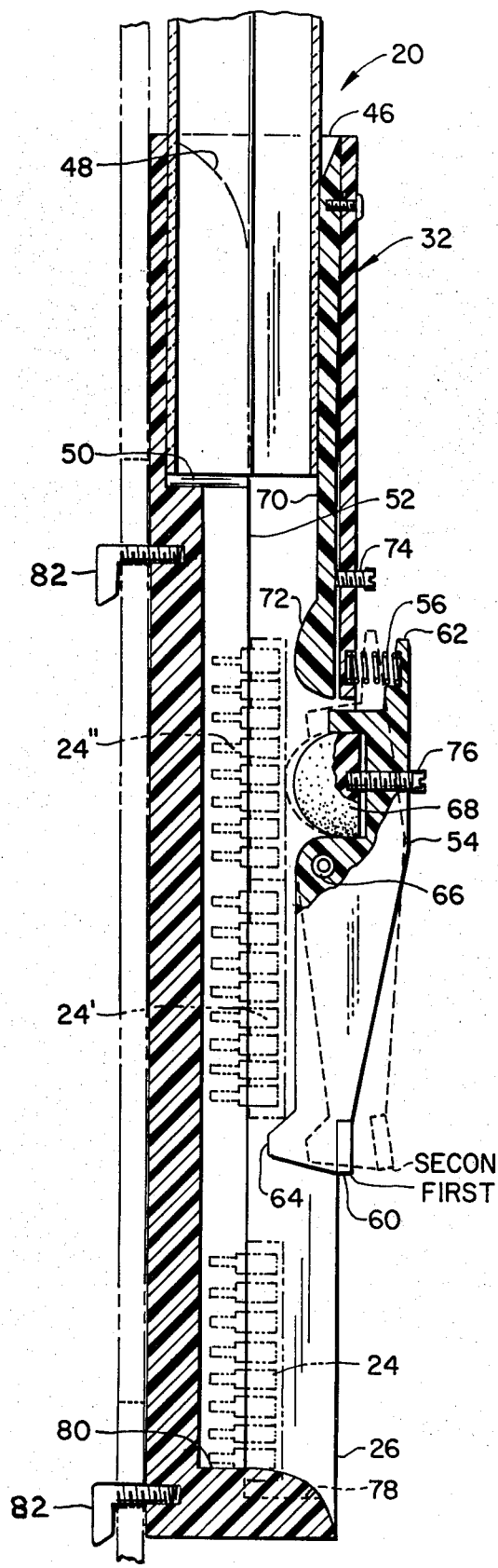
FIG._4.
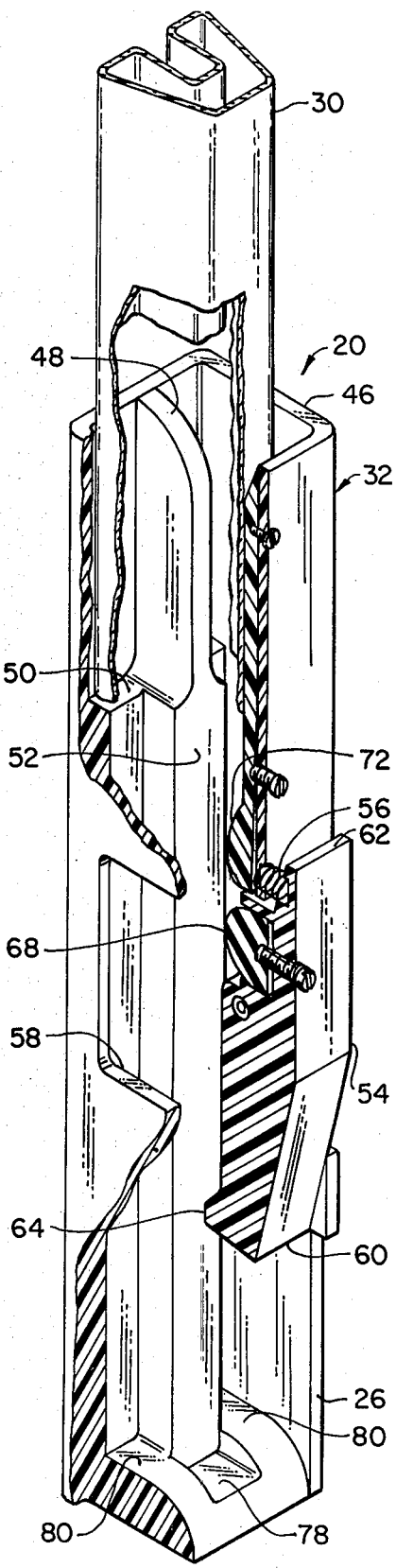
FIG._3.

METHOD AND APPARATUS FOR LOADING CIRCUIT BOARDS

BACKGROUND OF THE INVENTION

1. Field of Invention

This invention relates to devices and techniques for manually or semimanually emplacing circuit components on a planar printed circuit board and more specifically relates to a method and mechanism for programmed loading of a printed circuit board with dual-in-line-type integrated circuit packages.

One of the principal labor-intensive procedures in the manufacture of circuit systems, especially complex digital circuit systems, is the placement of integrated circuit devices or packages as defined locations on a perforate substrate having a defined wiring pattern imprinted thereon. The substrate is known loosely in the art as a circuit board. (Herein, a circuit board shall refer to the substrate exclusive of circuits mounted thereon.) The volume and nature of the circuit board assembly process in most manufacturing operation seldom justifies the expense and complication of totally automated circuit board loading devices. However, there is need for organizing and modifying the nature and extent of manual movement in the assembly or loading of circuit boards with circuit devices.

2. Description of the Prior Art

Fully automated machines are known for loading integrated circuit devices onto a circuit board. However, most circuit board loading is performed manually, with buckets or trays of integrated circuits disposed at a loading station. Manual loading of this sort requires some knowledge of the types of circuits involved, a blueprint illustrating the placement of the circuits on the board, and extensive manual handling of the circuit devices.

At least one manufacturer, Micro Electronic Systems, Inc. of Danbury, Connecticut, produces a dispenser for integrated circuit packages of the dual-in-line package (DIP) type. The IC dispenser includes multiple channels in vertically stacked tires which are intended to eliminate double handling of the DIP IC devices. However, the IC dispenser of the prior art requires prior knowledge of component placement and it has a tendency toward spillage. In particular, there is no provision for dispensing singular DIP ICs.

There is a need for an apparatus and a technique for speeding the manual loading of integrated circuit devices of the dual-in-line-type onto circuit boards which is inexpensive and reliable.

Summary of the Invention

According to the present invention, a method and apparatus are provided for serially dispensing dual-in-line-type (DIP) integrated circuit devices (ICs) for use in manually loading circuit boards. Integrated circuit devices are placed in queues in a plurality of tubular dispensers and aligned front end to back end. The dispensers are adapted to serially release individual circuit devices to an access position within the dispensers. The dispensers are mounted on laterally moveable frames in a rack and can be withdrawn from the rack over a circuit board at an array position substantially directly over and adjacent the position on the circuit board into which the circuit devices are to be loaded. The dispensers comprise an indexing head which releases only single ones of the circuit devices for rapid and convenient manual transfer from the access position of the dispenser to the load position on the board. A plurality of stations can be disposed in an assembly line with a board advancement mechanism such as a conveyor belt to implement speed-controlled loading of circuit boards. The apparatus is extremely simple and involves a minimum of moveable parts. The apparatus is so designed to permit even the most unskilled worker to use it without substantial supervision to load a circuit board, and it permits rapid programming of loading procedures without the need for a blueprint. Furthermore, it eliminates double handling and spillage of the integrated circuit devices.

An object of this invention is to provide a dispenser for integrated circuit packages for assisting in the manual loading of integrated circuit devices, particularly dual-in-line-type integrated circuit devices, onto a circuit board, to eliminate excess labor and ultimately to reduce the cost of assembly and manufacture of circuit board-based systems. The invention herein disclosed has been shown to reduce the labor time involved in loading circuit boards to approximately one-sixth the time required for strictly manual and unprogrammed loading of a circuit board.

Another important object of the invention is to provide a system which is not readily disabled by defectively shaped or misaligned circuit packages, which is a potential shortcoming of co-called fully automated circuit board loading systems, since a substantial percentage of the sophistication required in fully automated circuit devices is accounting for misaligned or defective devices. According to the present invention, individual channels for carrying circuit devices are removable from the location, and means are also provided for freeing any jammed devices within a channel.

A further object of the invention is to substantially eliminate double handling of DIP type ICs. In the present invention, this is accomplished by providing a dispensing mechanism which directly interfaces with the standard shipping sticks or tubes, which dispensing device is adapted to serially release only individual of the integrated circuit devices therefrom.

A still further object of the invention is to provide a system which substantially eliminates any need for a blueprint of the circuit layout at each loading station. This is accomplished by providing a rack with laterally moveable frames which can be withdrawn and disposed directly over a circuit board or a pattern of circuit boards in a X-Y pattern which directly designates the placement of integrated circuit devices on a circuit board located thereunder. In particular, the IC dispensers can be located on the moveable frames directly in position in a predefined Cartesian coordinate system.

It is a further object of the invention to eliminate manual handling of integrated circuit packages. This is accomplished in connection with the instant invention by use of an appropriate tool insertable and alignable within the access position of the dispensing device which permits an operator to grasp an individaul DIP and to place it directly onto the circuit board uncontaminated by human hands.

Other objects and advantages of the invention will be apparent upon reference to the following detailed description.

BRIEF DESCRIPTION OF THE DRAWINGS

The invention will be better understood by reference to the following detailed description taken in conjunction with the accompanying drawings in which:

FIG. 1 is a perspective view of a loading station according to the invention;

FIG. 2 is a side view of an assembly line comprising a series of loading stations;

FIG. 3. is a cutaway perspective view of a dispensing device according to the invention; and FIG. 4 is a side elevational view of dispensing device according to the invention.

DETAILED DESCRIPTION OF PREFERRED EMBODIMENTS

According to the invention, an apparatus is provided for use in manually loading a circuit board with dual-in-line-type integrated circuit devices, and a technique is disclosed for loading circuit boards in a programmed manner to avoid duplication of effort and confusion as to location and orientation of integrated circuit devices on the circuit board.

Referring to FIG. 1, there is shown in perspective view a loading station 10 according to the invention. The loading station 10 comprises a rack 12 which houses a plurality of planar frame assemblies 14 slidably mounted to tracks 16 (upper) and 19 (lower) disposed in parallel within the rack 12. The tracks 16, 19 are parallel and offset vertically to allow the frames 14 to slide laterally in and out of the rack 12 exposing the face 18 of the frame 14 in and upright slightly slanted position.

The frame face 18 is adapted to receive integrated circuit dispensers 20 spaced laterally at selected locations along the lower edge 22 of the frame 14, all of the frames 14 being disposed in an inclined parallel array. The angle of incline is selected for convenience of working and to provide a gravity feed for integrated circuit devices temporarily stored within the integrated circuit (IC) dispensers 20.

The IC dispensers 20 are adapted to dispense singular dual-in-line package type IC devices or DIPs 24 from an access position or exit port 26 at an exit end. The IC dispenser 20 is disposed or "programmed" to be located at a selected lateral position on the frame 14 as viewed facing the frame face 18. In addition, each of the frames 14 mounted to the lower tracks 19 can be located relative to a selected longitudinal position of the rack 12. In this manner, the exit ports 26 of the IC dispensers 20 can be disposed directly over defined horizontal Cartesian coordinates and above a device-receiving position. The device-receiving position may be defined area on a fixed table, such as a light table 28, or it may be a location on an intermittently moveable belt, as explained below.

The apparatus according to the invention is programmed and used as follows: Each IC dispenser 20 is loaded with a plurality of DIPs 24 arranged in a queue. The loading may comprise placing the DIPs 24 in the correct front to back orientation in a tube 30 which is especially adapted to carry dual-in-line-type integrated circuits and then fitting the tube 30 to a dispensing head 32 of the dispensing means 20, or it may comprise loading DIPs 24 directly into a tube 30 already fitted to a dispensing head 32. The dispensing head 32 may be mounted to the frame face 18 either before or after the tube loading operation. The IC dispenser 20 is located at a selected lateral location along the lower edge 22 of the frame face 18 according to the desired receiving location and pin orientation of the DIP 24 contained therein. In particular, the position is defined by fully withdrawing the frame 14 from the rack 12, placing a circuit board 34 which is to be loaded at the device-receiving location of the table 28 below and adjacent the frame 12 and placing the IC dispensers 20 along a horizontal support 36 directly above and adjacent to perforations 38 in the circuit board 34 which are adapted to receive the DIPs 24.

After the frames 14 have been loaded with DIPs 24, the loading station 10 is in condition for a loading operation. A circuit board 34 is placed in the device-receiving position. Thereupon, one frame 14 is withdrawn from the rack 12. Each dispenser 20 on a frame 14 is activated to release one DIP 24 to the exit port 26. Then each of the released ICs is manually transferred from the exit port to the IC-receiving perforations 38 adjacent thereto. The transfer may be effected by a device insertion tool especially adapted to grip the sides of the dual-in-line-type integrated circuit. One such tool is manufactured by Micro Electronic Systems, Inc. of Danbury, Conn. and marketed under the trade name DIP-A-DIP Insertion Tool. The tool is adapted to compress the side terminals of the DIP 24 to render it easier to insert into the perforations 38.

After all DIPs 24 to be dispensed along one row of the circuit board 34 have been loaded thereon, the frame 14 is returned to its rest position within the rack 12 and the next frame 14 is withdrawn and placed over the next row to be loaded. The process is repeated for each frame containing DIPs 24 to be loaded unto the circuit board 34. The light table 28 is used to illuminate the perforations 38 in the circuit board 34 making it somewhat easier to locate the perforations 38 and to check the integrity of the perforations.

Turning now to FIG. 2, there is shown an assembly line 40 comprising a plurality of loading stations 10 serially disposed along a bench 42 or the like. The loading stations 10 are arranged such that the frames 14 at each loading station can be withdrawn from the respective racks 12 over a device-receiving position along the bench 42. The bench 42 defines a line between adjacent stations 10. In addition, means, such as a moveable platform or conveyor belt 44, may be provided below the device-receiving positions at each of the stations 10. The belt 44 is operative to convey the circuit boards 34 between the stations 10 along the bench 42. The belt 44 may be operative to intermittently move circuit boards 34 between the stations 10, and a efficient semi-manual loading method can be performed in the assembly line according to the invention. In particular, a single worker at each of the stations 10 may load a portion of the circuit board 34 with integrated circuits 24 from a withdrawn frame 14. After completing the task, the belt 44 may be advanced to convey a partially loaded circuit board 24 to the next station where a second worker in the series loads a portion of the circuit board 34 with integrated circuits 24 from a withdrawn frame 14. Thereafter, the belt 44 is again advanced to convey the circuit board 34 to a third station for loading integrated circuits 24 from a withdrawn frame 14. The conveyor belt is stationary for a length of time determined to be sufficient to permit the slowest operator to complete the task at his or her assigned loading station. The tasks at each loading station have been predefined to require approximately equal amounts of time. The timing of the movement of belt therefore paces the workers and determines the speed of assembly of each circuit board 34.

The use of a loading station according to the invention assures that the amount of wasted movement by each worker is minimized. For example, the hand and eye movement during the assembly process can be as little as two to four inches.

Turning now to FIGS. 3 and 4, details of the IC dispenser 20 and particularly of the dispensing head 32 are shown. The dispensing head 32 is embodied in a tubular housing having an entrance end 46, an exit port 26 with intermediate tubular side walls and an indexing mechanism comprising a lever member 54. The entrance end 46 is adapted to receive a tube 30 of the conventional U-shape used for storing and transporting dual-in-line package integrated circuits. A radial guide tongue 48 on one side wall extends centrally toward the entrance end 46 along the axis of the housing of the indexing head 32, the guide tongue 48 being adapted to interlock with a central longitudinal depression in the standard tube 30. Stops 50 define the extent to which the tube 30 may be inserted into the indexing head 32 and adjacent to stops 50. The stops 50 are flanges extending laterally from the guide tongue 48, the guide tongue 48 terminates on a widened raised guideway 52 which extends substantially the remaining length of the indexing head 32.

Although indexing mechanisms of various designs might be utilized which are capable of releasing singular DIPs 24 from a queue to the access position, the preferred embodiment of an indexing mechanism is an elongate lever member 54 attached to the housing of dispensing head 32 and which is reciprocally moveable between a first position and a second position (FIG. 4). Specifically, the lever member 54 has a tip end 60 and tail end 62, with a flange 64 extending laterally at the tip end 60 into the path of DIPs 24. The lever member 54 is hinged at a pivot 66, and on the tail end 62 side of pivot 66, a resilient pad 68 is mounted to the lever member 54. The shape and lateral extension of the flange 64 into the path of DIPs 24 and the shape, resiliency, location and lateral extension of pad 68 near the tail end 62 are selected such that when the lever member 54 is in the first position, the first DIP 24' (FIG. 4) in the queue is blocked only by the flange 64 and when the lever member 54 is in the second position, the second DIP 24" in the queue is held while the first DIP 24' is released to the access position of the exit port 26. In the second position, the pad 68 presses the second DIP 24" against the guideway 52. However, with the lever member 54 in the first position, the flange 64 merely blocks the leading end of the first DIP 24' in the queue.

The flange 64 of lever member 54 is preferably tapered at the side adapted to abut the first DIP 24' in the queue. When the lever member 54 is in the first position, the taper is preferably no less than twenty degrees relative to an axis extending longitudinally through the dispensing head 32 and preferably the angle is between about forty degrees and about fifty degrees of that axis.

Whereas the flange 64 blocks the first IC 24 in the queue, the pad 68 frictionally engages the second IC 24 when the indexing mechanism 54 is in the second position. By frictionally engaging, it is meant that the pad 68 presses the IC 24 against the guideway 52. The pad 68 may be a hemispherical rubber grommet with a Shore D durometer hardness of about thirty.

The dispensing head 32 may include a slot or window 58 (FIG. 3) in the housing side wall for observing the operation of the indexing mechanism 54 and also for providing access to integrated circuits 24 along the raised guideway 52. In the event any of the integrated circuits 24 become jammed along guide way 52, they can be loosened through window 58. Alternatively, a portion of the side wall may be transparent for viewing.

The height dimension of the path between the guideway 52 and inner wall of the housing of the dispensing head 32 has been found to be an important parameter of DIP alignment. Therefore a tongue 70 with a knob 72 may be provided along the inner side of the top wall of the housing of the dispensing head 32 immediately upstream of the lever member 54. The knob 72 or other protrusion from the inner wall extends toward the guideway 52 to define an aperture sufficiently spaced from guideway 52 to allow a DIP 24 to pass through but not so spaced as to permit a DIP 24 to slip out of alignment along the guideway 52. Where the height dimension of the body of the integrated circuit package is expected to vary, an adjustment screw 74 may be provided to set the height of the knob 72 relative to the guideway 52. Where the height of the integrated circuit is expected to be substantially uniform, however, the tongue 70 and adjustment screw 74 may be eliminated and the knob 72 may be integrated into the side wall of the dispensing head 32 opposing the guideway 52.

It has been found to be convenient to provide height adjustment of the pad 68 by means of a pad adjustment screw 76. In this manner, the pressure of the pad 68 against DIP 24" disposed immediately below can be adjusted relative to the release point of the lever member 54.

A further feature of the invention lies in the foot of the guideway 52 adjacent the exit port 26, which is provided with a special purpose recess 78. The recess 78 is selected to be at least as wide as an integrated circuit package and sufficiently deep to permit a leg of an integrated circuit package disposed in the exit port 26 to rest against abutting end walls 80 of the laterally disposed exit port 26. This important feature simplifies the task of removing and aligning an integrated circuit package from the exit port, since it enables an operator to place an integrated circuit insertion tool along the end walls 80 in longitudinal alignment with the legs of the integrated circuit package. Moreover, the end walls 80 are rounded along the exit port as a further convenience to guide the insertion tool into ready alignment with the circuit package at the exit port 26.

The preferred material for the dispensing head 32 is nylon containing an astatic compound. The head 32 may be constructed in a single mold of one piece of material, including the lever member 54 (except for pivot 66). Provision may be made for such by forming the lever member in integral 54 in a separate mold portion with a leaf (not shown) of thin pliant nylon material connecting the tail end 62 to the main body. In this manner the lever member 54 is moveable relative to the housing at the pivot 66.

In order to accommodate the mounting of the indexing head 32 to the frame 14 (FIG. 1), the housing includes hooks 82 (FIG. 4) which are adapted to engage eyes 90 and 92 (FIG. 1) on the horizontal support 36 of the frame 14. The eyes 90 and 92 are vertically aligned and spaced on centers close enough to accommodate IC dispensers 20 juxtaposed to one another across the frame 14.

The invention has now been explained with reference to specific embodiments. Other embodiments will be obvious to those of ordinary skill in this art from this disclosure. It is therefore not intended that the invention be limited except as indicated by the appended claims.

We claim:

1. A method for manually loading a circuit board with dual-in-line-type integrated circuit devices employing a programmable apparatus which comprises at least one rack disposed adjacent a loading position, at least one substantially planar frame means adapted to be laterally slidably mounted to said rack, and at least one means for serially dispensing said circuit devices and adapted to be attached at horizontal locations to said frame means, said method comprising the steps of:
   (a) filling said dispensing means with said circuit devices aligned front to back in a queue;
   (b) mounting said dispensing means on selected ones of said frame means at preselected locations corresponding to defined mounting locations for said circuit devices, said mounting locations being specifiable in a Cartesian coordinate system;
   (c) placing a circuit board adjacent said rack and below the sliding path of said frame means, said circuit board having device-receiving position corresponding to said mounting location;
   (d) withdrawing a first one of said frame means from said rack to place said frame means over said mounting location;
   (e) releasing single ones of said circuit devices through said dispensing means on said withdrawn frame means into said access positions;
   (f) removing each one of said released circuit devices from said access positions; and
   (g) placing said removed circuit devices in the device-receiving positions corresponding thereto.

2. A method according to claim 1 further comprising:
   performing the steps (a), (b), and (c) for at least one further programmable apparatus;
   removing said circuit board from a first one of said programmable apparatus to a second one of said programmable apparatus; and
   performing thereafter said steps (c), (d), (e), (f), and (g).

3. An apparatus for use in manually loading dual-in-line-type integrated circuit devices onto a circuit board disposed in a receiving area, said apparatus comprising:
   a rack disposed adjacent said receiving area;
   a plurality of means for manually dispensing selected ones of said circuit devices from a queue, each one of said dispensing means including means for supporting a tubular container which is for holding said circuit devices end to end, said dispensing means further including means for releasing only single ones of said circuit devices from said containers to an access position and supporting only single one of said devices from said queue at said access position; and
   a plurality of substantially planar frame means, each one of said frame means being slidably mounted to said rack in an inclined, closely-spaced array, each rack including means for supporting, along its lower horizontal edge, a plurality of said dispensing means in substantially one angularly downwardly inclined plane, wherein the access position of said dispensing means is adjacent said lower edge of said frame means, each said frame means being movable from a first position within said rack to a second position over said receiving area, said rack and said frame means being substantially devoid of obstacles between said receiving area and said access position such that each single circuit device, in its respective queue, is vertically aligned with a defined horizontal matrix location of said receiving area for transferring each single circuit device from said access position to a corresponding vertically aligned underlying device receiving position in said receiving area.

4. An apparatus according to claim 3 further including means for back lighting said device-receiving area.

5. An apparatus according to claim 3 wherein said dispensing means comprises:
   a tubular housing having an entrance end with an opening aligned with a longitudinal axis through said tubular housing;
   an exit end defining said access position for said circuit devices, said exit end comprising a lateral exit port and a stop adjacent said exit end, said stop comprising a recess for receiving and aligning a leading end of each one of said circuit devices after release by said releasing means and wherein a surface between said recess and said exit port is tapered from a maximum adjacent said recess to a minimum adjacent said exit port, said releasing means further including a guide rail disposed along said longitudinal axis within said housing, said guide rail for supporting said circuit devices in a position straddling said guide rail and wherein opposing inner walls of said housing adjacent said exit port are spaced from one another sufficient to permit insertion of a tool for grasping opposing lateral sides of said circuit device, such that said recess, said opposing inner surfaces, said guide rail and said tapered surface cooperate to guide said grasping tool into aligned engagement with opposing lateral sides of a released one of said circuit devices.

6. An apparatus according to claim 5 wherein said dispensing means includes a member reciprocally movable about an axis perpendicular to said opposing inner walls between a first position and a second position, wherein said movable member is an elongate member having a tip end, an opposing tail end, a flange extending laterally at said tip end in a plane perpendicular to said longitudinal axis for selectively blocking a leading edge and thereby advancement of said first one of said circuit devices to said exit end only while said elongate member is in a first position, and a resilient pad adjacent said tail end and spaced sufficiently from said tip end to be disposed adjacent to a second one of said circuit devices in said queue, said resilient pad being extended sufficiently to engage a top side of said second one of said circuit devices against said guide rail before said first one of said circuit devices is released when said elongate member is moved from said first position to said second position.

7. An apparatus according to claim 6 wherein said flange has a face opposing a leading edge of said first one of said circuit devices, said face being tapered at an obtuse angle to said elongate member such that in said first position its angle is no less than about 20 degrees to a plane perpendicular to said longitudinal axis, said face lying in a plane perpendicular to a plane bisecting said circuit devices along said longitudinal axis.

8. An apparatus according to claim 7 wherein said face is said first position is tapered at an angle between about 40 degrees and 50 degrees of said plane perpendicular to said axis.

* * * * *